(12) United States Patent
Rudberg et al.

(10) Patent No.: US 12,073,845 B2
(45) Date of Patent: *Aug. 27, 2024

(54) AUTOMATIC GAIN CONTROL BASED ON MACHINE LEARNING LEVEL ESTIMATION OF THE DESIRED SIGNAL

(71) Applicant: Google LLC, Mountain View, CA (US)

(72) Inventors: Karl Allan Tore Rudberg, Älvsjö (SE); Alessio Bazzica, Järfälla (SE)

(73) Assignee: Google LLC, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/120,911

(22) Filed: Mar. 13, 2023

(65) Prior Publication Data
US 2023/0215451 A1 Jul. 6, 2023

Related U.S. Application Data

(63) Continuation of application No. 16/820,578, filed on Mar. 16, 2020, now Pat. No. 11,605,392.

(51) Int. Cl.
G10L 21/0208 (2013.01)
G06N 20/00 (2019.01)
(Continued)

(52) U.S. Cl.
CPC .......... *G10L 21/0208* (2013.01); *G06N 20/00* (2019.01); *G10L 21/0364* (2013.01); *G10L 25/27* (2013.01); *G10L 25/84* (2013.01)

(58) Field of Classification Search
CPC . G10L 21/0208; G10L 21/0364; G10L 25/27; G10L 25/84; G10L 21/034; G10L 21/0216; G10L 21/0232; G06N 20/00
See application file for complete search history.

(56) References Cited

U.S. PATENT DOCUMENTS 5,790,137 A   8/1998  Derby et al.
5,970,137 A * 10/1999  Le Damany ............ H04M 9/08
                                              379/202.01
(Continued)

FOREIGN PATENT DOCUMENTS

CN   108141502 A   6/2018
CN   110168640 A   8/2019
(Continued)

OTHER PUBLICATIONS

Valin, J. "RNNoise: Learning Noise Suppression" Mozilla Emerging Technologies and xiph.org, Sep. 27, 2017, 12 pages, downloaded from https://people.xiph.org/~jm/demo/mnoise/ on Nov. 26, 2019.

(Continued)

*Primary Examiner* — Vijay B Chawan
(74) *Attorney, Agent, or Firm* — Lowenstein Sandler LLP

(57) ABSTRACT

Method includes receiving, at a server device, from a plurality of input devices, audio data. The audio data of each input device corresponds to a time-related portion of the audio data. The method determines a speech energy level for each input device by providing the time-related audio portion as input to a trained model. For each input device, a statistical value associated with the speech energy level is determined. A strongest input device is identified based on the statistical value. The statistical value associated with the speech energy level of each input device other than the strongest input device is compared to the statistical value of the strongest input device. Depending on the comparison, the method determines whether to update the gain value of an input device to an estimated target gain value based on the statistical value of the speech energy level of the respective input device.

20 Claims, 6 Drawing Sheets

(51) Int. Cl.
 *G10L 21/0364* (2013.01)
 *G10L 25/27* (2013.01)
 *G10L 25/84* (2013.01)

(56) References Cited

U.S. PATENT DOCUMENTS

| | | | | |
|---|---|---|---|---|
| 5,983,183 | A * | 11/1999 | Tabet | H03G 3/3089 |
| | | | | 381/108 |
| 9,325,853 | B1 * | 4/2016 | Marinov | H04L 69/22 |
| 10,511,718 | B2 * | 12/2019 | Dickins | H04M 3/42221 |
| 10,728,656 | B1 * | 7/2020 | Zhou | H04R 5/04 |
| 10,878,840 | B1 * | 12/2020 | Mitchell | G06N 20/00 |
| 11,164,592 | B1 * | 11/2021 | Wu | G10L 21/034 |
| 11,605,392 | B2 * | 3/2023 | Rudberg | H03G 3/32 |
| 2007/0127671 | A1 * | 6/2007 | Chua | H04L 12/1827 |
| | | | | 379/202.01 |
| 2009/0161883 | A1 * | 6/2009 | Katsianos | H04S 7/00 |
| | | | | 381/57 |
| 2016/0099007 | A1 * | 4/2016 | Alvarez | G10L 21/034 |
| | | | | 704/225 |
| 2016/0261951 | A1 * | 9/2016 | Matheja | H04R 3/12 |
| 2023/0215451 | A1 * | 7/2023 | Rudberg | G10L 25/27 |
| | | | | 704/226 |

FOREIGN PATENT DOCUMENTS

| | | |
|---|---|---|
| CN | 101802909 A | 8/2020 |
| CN | 102017402 A | 4/2021 |

OTHER PUBLICATIONS

Lao, Y, et al. "Conv-TasNet: Surpassing Ideal Time-Frequency Magnitude Masking for Speech Separation", IEEE/ACM Transactions on Audio, Speech and Language Processing, Aug. 2019, 12 pages, vol. 27:8.
Valin, J. "A Hybrid DSP/Deep Learning Approach to Real-Time Full-Band Speech Enhancement", IEEE 20th International Workshop on Multimedia Signal Processing, Aug. 29-30, 2018, 5 pages.
Wilson, K. et al. "Exploring Tradeoffs in Models for Low-Latency Speech Enhancement", 26 International Workshop on Acoustic Signal Enhancement (IWAENC), Sep. 17-20, 2018, 5 pages.
Hershey, S. "CNN Architectures for Large-Scale Audio Classification", IEEE International Conference on Acoustics, Speech and Signal Processing (ICASSP), Mar. 5-9, 2017, 5 pages.
PCT Notification of Transmittal of The International Search Report and The Written Opinion of The International Searching Authority for PCT Application No. PCT/US2020/053645, mailed Jan. 19, 2021, 18 pages.
Chinese Patent Application No. 202080098632.X Office Action dated Jun. 3, 2023, 13 pages.
Indian Patent Application No. 202247057149 Office Action dated Dec. 9, 2022, 6 pages.
Office Action and Search Report for Chinese Application No. CN202080098632.X dated Jun. 3, 2023, 12 Pages.

* cited by examiner

AUTOMATIC GAIN CONTROL BASED ON MACHINE LEARNING LEVEL ESTIMATION OF THE DESIRED SIGNAL

RELATED APPLICATION

This application is a continuation of U.S. patent application Ser. No. 16/820,578, filed Mar. 16, 2020, entitled "AUTOMATIC GAIN CONTROL BASED ON MACHINE LEARNING LEVEL ESTIMATION OF THE DESIRED SIGNAL," which is hereby incorporated by reference in its entirety.

TECHNICAL FIELD

Aspects and implementations of the present disclosure relate to the field of audio processing, and more particularly to basing the automatic gain control on a machine learning estimation of the desired signal level.

BACKGROUND

Automatic Gain Control (AGC) is an audio pre-processor that adjusts the gain of the input signal in order to establish a normalized output signal level. The AGC aims to provide a comfortable audio output for a listener, and is often used in audioconferencing and videoconferencing equipment. An AGC may increase a weak input signal and decrease a strong input signal toward a set average signal level in order to produce a suitable and steady output volume. In audio conferencing, the AGC may amplify weak speech and dampen loud background noise to produce a comfortable speech output level.

SUMMARY

The following is a simplified summary of the disclosure in order to provide a basic understanding of some aspects of the disclosure. This summary is not an extensive overview of the disclosure. It is intended neither to identify key or critical elements of the disclosure, nor to delineate any scope of the particular embodiments of the disclosure or any scope of the claims. Its sole purpose is to present some concepts of the disclosure in a simplified form as a prelude to the more detailed description that is presented later.

In some implementations, a system and method are disclosed for an automatic gain control based on a machine learning estimation of the desired signal. A processing device may receive, through a plurality of channels, audio data corresponding to a plurality frequency ranges. For each of the frequency ranges for each channel, the processing device may determine a speech audio energy level and/or a noise energy level by inputting the audio data from each respective frequency range into a machine learning model that is trained to determine speech audio energy levels and noise energy levels of given audio data. Using the speech audio energy level and/or the noise energy level for each frequency range, the processing device may determine the speech signal of the audio received from each channel. The speech signal may represent the original audio data with the background noise removed, sometimes referred to as a denoised signal.

The processing device may then determine, for each channel, the energy of the speech signal, as well as the energy of the smoothed speech signal. One way to measure the energy of a signal is to determine the root mean square of the signal. Hence in some implementations, the processing device may determine, for each channel, the root mean square of the speech signal, as well as the root mean square of the smoothed speech signal. The root mean square is the square root of the average of the square of the sound signal over a given duration. In other implementations, the processing device may measure the energy using a different measuring technique. For example, the processing device may use a peak measurement, or a peak-to-peak measurement of the signal. A peak noise measurement is the range in signal between zero and the highest point in the signal. A peak-to-peak noise measurement is the range in signal between the most negative signal and the most positive signal. For illustration purposes, the disclosure discusses the energy of the speech signal in terms of root mean square, however other energy measurements may be used.

The channel that has the highest speech signal root mean square and the highest smoothed speech signal root mean square may be determined to be the strongest channel. If both of the root mean square of the strongest channel's speech signal and the smoothed root mean square of the strongest channel's smoothed speech signal satisfy a threshold condition, the processing device may then compare each channel's speech signals to that of the strongest channel. Specifically, the processing device may compare each channel's speech signal's root mean square with the strongest channel's speech signal's root mean square, and each channel's smoothed speech signal's root mean square with the strongest channel's smoothed speech signal's root mean square. Depending on this comparison, the process device may determine whether to update the gain value for the respective channel based on the root mean square of the smoothed speech signal of the respective channel.

The subject matter, summarized above and described below in more detail, enables increased sound quality in videoconference and audioconference meetings. The videoconference or audioconference device may record audio input data. Based on the collected audio data, the technology described herein may use the desired signal level estimated by a machine learning model to improve the automatic gain control of the audio system. Thus, higher audio quality is enabled that is less prone to sudden or undesirable gain changes.

The subject matter described herein is not limited to the above exemplary listed advantages. Further advantages are achievable and recognizable in view of the disclosure of the present application.

BRIEF DESCRIPTION OF THE DRAWINGS

Aspects and implementations of the present disclosure will be understood more fully from the detailed description given below and from the accompanying drawings of various aspects and implementations of the disclosure, which, however, should not be taken to limit the disclosure to the specific aspects or implementations, but are for explanation and understanding only.

Figure 1:
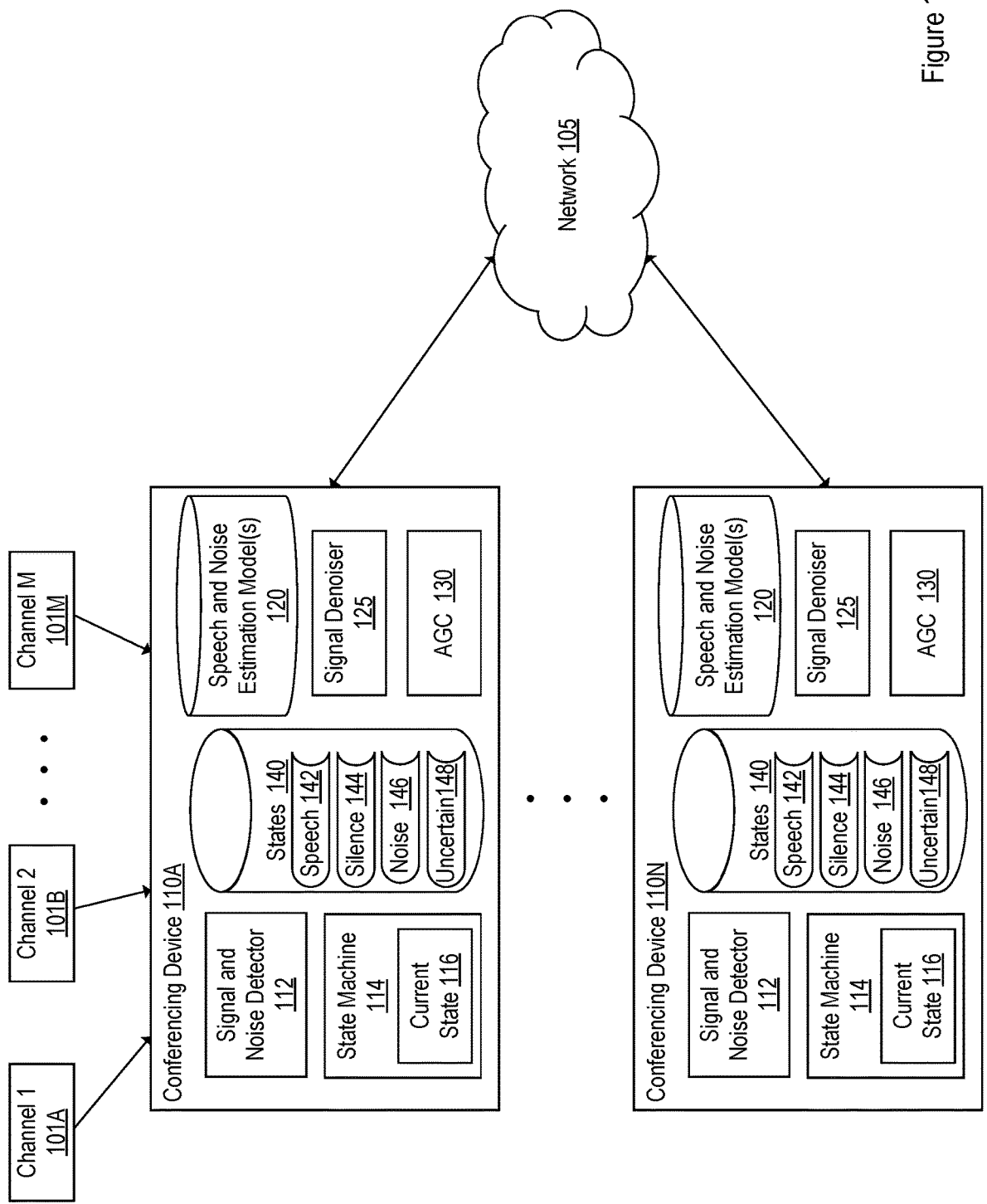
FIG. 1 illustrates an example conferencing system architecture for an automatic gain control based on machine learning level estimation of the desired signal, in accordance with an implementation of the disclosure.

These drawings may be better understood when observed in connection with the following detailed description.

DETAILED DESCRIPTION

Modern conferencing systems, as well as other audio systems, may use an automatic gain control (AGC) to adjust the output of one or more input signals toward a preset signal level, to produce a nearly constant output volume. The goal of the automatic gain control may be to increase the volume of speech and decrease the volume of the background noise, while maintaining a steady volume for the output signal. Modern automatic gain controls may use a variety of techniques to differentiate between speech and noise in the input signals. Many of these techniques make assumptions on the noise versus speech status of a room using a binary decision for each input channel, by deciding whether an input signal is either noise or speech. These assumptions may overlook a weak speech input signal in a noisy room, for example, resulting in the undesirable outcome of dampened speech.

Additionally, many automatic gain controls do not take into consideration the output level of the desired signal, and are instead use a preset output signal level. Using a preset output signal level may result in dampening speech in a noisy room, or augmenting noise in a quiet room, both of which result in gain changes that may be annoying or distracting to the user. These automatic gain controls waste computing resources by dampening speech signals and augmenting noise signals because they do not take into consideration the state of the room and the desired signal level, resulting in potentially unintelligible conference meetings or incomprehensible recordings.

Aspects and implementations of the present disclosure address the above and other deficiencies or problems by using outputs of a machine learning model to enhance the speech detected in an input signal by removing the background noise. Aspects of the present disclosure may then use the enhanced speech input signal to estimate the level of the desired signal, and use the estimated signal level in an automatic gain control algorithm to gradually update the gain of the output toward the estimated desired signal level. Aspects of the present disclosure may further use the enhanced speech input signal to determine the current state of the room, and use that determination in the automatic gain control decision.

Audioconferencing, videoconferencing, or other audio systems are capable of recording audio data from one or more input channels, such as microphones. The audio system may analyze the audio data, or may transfer the audio data to a separate processing device that may then analyze the audio data. For each input channel, the processing device may use a model trained to determine the level of speech audio and the level of noise in each audio signal. The model may be trained using machine learning and audio segments that are each labeled with the level of speech audio included in the audio segment and the level of noise included in the audio segment. By applying the model to each audio signal, the processing device is able to create a denoised audio signal, i.e., a signal that represents only the speech, with the background noise removed.

The processing device may then use the denoised speech signal of each input channel in the automatic gain control. The processing device may determine the root mean square of each channel's denoised speech signal, as well as the root mean square of each channel's smoothed denoised speech signal. The root mean square of given data is a statistical measurement associated with a signal, and calculates the average signal over a period of time. For audio signals, the signal value is squared and an average is calculated over a period of time. The square root of the result is then calculated to determine the root mean square of the signal. The root mean square of an audio signal represents the effective power, or strength, of that audio signal.

Alternatively or additionally, the processing device may measure the energy level of the audio signals using other well-known measuring methods, and is not limited to using the root mean square to measure the energy level of the signal. For example, the processing device may use a peak measurement of the signal, or a peak-to-peak measurement of the signal, as the one or more statistical values associated with energy level of a channel's speech signal. A peak noise measurement is the range in signal between zero and the highest point in the signal. A peak-to-peak noise measurement is the range in signal between the most negative signal and the most positive signal. For illustration purposes, the disclosure discusses the energy of the speech signal in terms of root mean square, however other energy measurements may be used.

Another statistical value associated with an energy level of a channel's speech signal is the statistical value associated with the smoothed denoised signal. For example, the processing device may also consider the root mean square of each channel's smoothed denoised signal. In smoothing an audio signal, the data points of the signal are modified such that individual points that are higher than their adjacent points are reduced, and individual data points that are lower than the adjacent points are increased, leading to a smoother signal. Smoothing may result in an improved signal-to-noise ratio, and may act as a low-pass filter, essentially reducing the high-frequency components and passing the low-frequency components with little change. The signal-to-noise ratio may compare the level of a desired signal to the level of background noise. In one implementation, the smoothing may have a half-time of 75 milliseconds.

If at least one of the input channels has a root mean square and a smoothed root mean square that satisfy a threshold condition, the processing device may then adjust the gain value of the channels that have a root mean square and smooth root mean square within a predefined range of the strongest channel's root mean square and smoothed root mean square. The processing device may update a channel's gain toward the estimated desired level. Each channel's estimated desired level may be based on the root mean square of the smoothed denoised speech signal of that channel.

Some technical advantages of implementations of the present disclosure include enhancing audio output, for example during audioconference or videoconference meetings. The systems and methods disclosed herein may reduce inefficient and wasteful consumption of conferencing resources by improving the audio output for all users, such as all attendees of a video or audioconference meeting. Some implementations of the present disclosure provide for more stable gain updates, stronger signal-to-noise ratios in conferencing devices, and fewer adaptations to weak noises and sounds. Additionally, some implementations of the present disclosure allow for a faster convergence to a desired gain value, leading to fewer wasted resources.

Various aspects of the above referenced methods and systems are described in detail herein below by way of examples, rather than by way of limitation.

FIG. 1 illustrates an example system architecture 100 for an automatic gain control based on machine learning level estimation of the desired signal, in accordance with an implementation of the present disclosure.

The system architecture 100 may include one or more conferencing devices 110A-110N connected to each other through a network 105. In other implementations, the conferencing devices 110A-110N may communicate directly with each other. The network 105 may be a public network (e.g., the Internet), a private network (e.g., a local area network (LAN) or wide area network (WAN)), or a combination thereof. The network 105 may include a wireless infrastructure, which may be provided by one or more wireless communications systems, such as a wireless fidelity (WiFi) hotspot connected with the network 105 and/or a wireless carrier system that can be implemented using various data processing equipment, communication towers, etc. Additionally or alternatively, the network 105 can include a wired infrastructure (e.g., Ethernet).

The conferencing devices 110A-110N may be audioconferencing devices or videoconferencing devices. In other implementations, the conferencing devices 110A-110N may be other audio processing devices. The conferencing devices 110A-110N may include one or more microphones; a video camera or webcam to provide video input; a computer screen, monitor, TV or projector to broadcast video output; speakers or headphones for audio output; and a computing device to compress analog audio and video data into digital packets on the distributing end, and decompress data at the endpoint. Additionally or alternatively, all or some of these features may be separate and communicatively coupled to the conferencing devices 110A-110N.

In one implementation, the conferencing devices 110A-110N may receive audio input from one or more input channels 101A-101M. The input channels 101A-101M may be microphones and/or other audio input devices. The conferencing device 110A-110N may process the audio data received through each input channel 101A-101M using an audio subsystem. The audio subsystem may include microphones, an analog to digital converter, a buffer, and various other audio filters. The microphones may be configured to detect sounds in the surrounding area such as speech. The analog to digital converter may be configured to sample the audio data detected by the microphones. The buffer may store the sampled audio data for processing by the conferencing device 110A-110N and/or for transmission by the conferencing device 110A-110N. In some implementations, the audio subsystem may be continuously active or may be active during times when the conferencing device 110A-110N is expecting to receive audio such as during a conference call. In this case, the microphones may detect audio in response to the initiation of the conference call with another conferencing device 110A-110N. The analog to digital converter may be constantly sampling the detected audio data during the conference call. The buffer may store the latest sampled audio data, such as the last ten milliseconds of sound. The audio subsystem may provide the sampled and filtered audio data of surrounding speech and background noise to another component of the conferencing device 110A-110N. In some implementations, the conferencing device 110A-110N may include one audio subsystem or an audio subsystem for each microphone.

The conferencing devices 110A-110N may include a signal and noise detector 112, a state machine 114 with corresponding states 140, a speech and noise estimation model(s) 120, a signal denoiser 125, and an automatic gain control (AGC) 120. The signal and noise detector 112 may be configured to apply the processed audio from each input channel 101A-101M to the speech and noise estimation model(s) 120. The signal and noise detector 112 may use the speech and noise estimation model(s) 120 to estimate the amount of speech signal and the amount of noise received through each channel 101A-101M. The signal and noise detector 112 may provide a particular number of seconds of audio from each input channel 101A-101M as an input to the speech and noise estimation model(s) 120. For example, the signal and noise detector 112 may provide the last eight milliseconds, ten milliseconds, sixteen milliseconds, or another period of time of audio received through each input channel 101A-101M as an input to the speech and noise estimation model(s) 120.

The signal and noise detector 112 may analyze several seconds of the audio received through each input channel 101A-101M using the speech and noise estimation model(s) 120. In some implementations, the signal and noise detector 112 may analyze audio in portions that include several milliseconds of audio, such as three or four milliseconds of audio. The signal and noise detector 112 may apply the output of the speech and noise estimation model(s) 120 to the signal denoiser 125 to determine the denoised speech signal for each input channel 101A-101M.

In some implementations, the signal and noise detector 112 and the speech and noise estimation model(s) 120 may be configured to determine the audio characteristics of each frequency range for each audio channel. The audio characteristics may indicate the level of speech and the level of noise in each channel's audio signal. The signal and noise detector 112 may receive audio data through input channel 101A and segment the audio data into different frequency ranges (also referred to as frequency bands). The frequency bands may be, for example, one hundred hertz bands, one hundred-twenty five hertz bands, or another similar frequency band size. The signal and noise detector 112 may provide the audio of each frequency band as an input to a different speech and noise estimation model 120 that is trained to determine the audio characteristics in that particular frequency band. Additionally, or alternatively, the speech and noise estimation model 120 may be configured to determine the audio characteristics for multiple frequency bands in the audio data.

In some implementations, the signal and noise detector 112 and the speech and noise estimation models(s) 120 may be configured to determine the audio characteristics of each audio channel in the time domain. The signal and noise detector 112 may receive audio data through input channels 101A-101M and segment the audio data into time-related portions (e.g., 2 milliseconds, 5 milliseconds, 20 milliseconds, etc.). Each time-related portion as a start time and an end time in the audio data. The signal and noise detector 112 may provide the time-related portions of audio data as input to a speech and noise estimation model 120 that is trained to determine denoised signals. The speech and noise estimation model 120 trained in the time domain may then output a speech signal with noise removed of each channel's audio signal.

The conferencing devices 110A-110N may include a state machine 114 that may store the current state 116 of the audio conference device 110A-110N. The state machine 114 maintains or adjusts the current state 116 of the conferencing device 110A-110N based on the audio characteristics determined by the signal and noise detector 112, using the speech and noise estimation model(s) 120. The state machine 114 may set the current state 116 to one of four states 140. The states 140 may include a speech state 142, a silence state 144, a noise state 146, and an uncertain state 148. The state machine 114 may maintain or switch the current state 116 each time the signal and noise detector 112 generates additional audio characteristics.

The state machine 114 may set the current state 116 to the speech state 142 if there are one or more channels that have a signal level above a signal level threshold. The state machine 114 may set the current state 116 to the speech state 142 if there are one or more channels that have a signal-to-noise ratio above a signal-to-noise level ratio. The signal-to-noise ratio may compare the level of a desired signal to the level of background noise. In some instances, the state machine 114 may set the current state 116 to the speech state 142 only if the noise level is below a noise level threshold.

The state machine 114 may set the current state 116 to the silence state 144 if all the channels have a signal level below a signal level threshold. The state machine 114 may set the current state 116 to the silence state 144 if all the channels have a signal-to-noise ratio below a signal-to-noise level ratio threshold.

The state machine 114 may set the current state 116 to the noise state 146 if all the channels have a noise level above a noise level threshold. The state machine 114 may set the current state 116 to the noise state 146 if all the channels have a noise level greater than the signal level or if the noise level is greater than the signal level by a particular threshold or relative decibel level.

The state machine 114 may set the current state 116 to the uncertain state 148 if all the channels have a signal level within a certain range. This range may indicate that the signal can either be silence or speech. The range may be from thirty decibels to forty decibels, for example, or another range.

The conferencing devices 110A-110N may include an automatic gain control (AGC) 130 that automatically updates the gain value for each input channel 101A-101M based on the current state 116 and the denoised signal from the signal denoiser 125. If the current state 116 is set to noise state 146 or silence state 144, the AGC may not update the gain value for any of the input channels 101A-101M, as adjusting the gain value of noise or silence may produce unwanted results. For example, increasing the gain value to adapt to a silent room may result in a high gain value that could be uncomfortably high when speech occurs. As another example, decreasing the gain value to adapt to a noisy room may result in a low gain value that could be too low when speech occurs, making the speaker difficult to hear.

If the current state 116 is set to speech state 142 and uncertain state 148, the AGC 130 may update the gain value of a channel 101A-101M. Otherwise, the AGC 130 may not update the gain value of a channel 101A-101M. To update the gain value, the AGC 130 may calculate, for each input channel 101A-101M, the root mean square (RMS) of the denoised speech signal from the signal denoiser 125, and the smoothed root mean square of the denoised speech signal from the signal denoiser 125, also referred to as the smoothed root mean square (SRMS). The denoised speech signal is smoothed in order to capture the important patterns in the signal while omitting potential outliers. In some implementations, the AGC 130 may bandpass the denoised speech signal to a specified frequency region. For example, in determining the RMS and the SRMS, the AGC 130 may consider only a subset of the frequencies. High frequencies may be removed because speech energy falls off rapidly for frequencies above a certain level, leading to poor signal-to-noise ratio.

The AGC 130 may then determine the strongest channel by comparing the RMS and SRMS of each channel. The strongest channel may be the one with the highest denoised speech signal RMS and highest denoised smoothed speech signal SRMS. If the RMS and the SRMS of the strongest channel's denoised speech signal each exceed a respective threshold value for a threshold period of time, the AGC may then update the gain of each channel that has a denoised speech signal RMS and a denoised smoothed speech signal SRMS within a predefined range of the strongest channel's denoised speech signal RMS and denoised smoothed speech signal SRMS respectively. A threshold period of time ensures that the threshold condition has been met for a sufficiently long period of time (e.g., 2 seconds). Otherwise, the AGC 130 may not update the gain value of a channel 101A-101M. Using a threshold value may help avoid adapting to weak noises and signals, which may lead to slowly increasing gain in periods without speech. In comparing the RMS and SRMS to the threshold values, the AGC may bandpass the estimated speech to a subset of frequencies, for example to the frequency region 350-4000 Hz.

In some implementations, the AGC 130 may compare the RMS and SRMS of the denoised speech signal of each channel 101A-101M to determine the strongest channel. The AGC 130 may then compare the denoised speech signal RMS and the denoised smoothed speech signal SRMS of each channel 101A-101M to the strongest channel's denoised speech signal's RMS and SRMS respectively. If the RMS of a channel's denoised speech signal, such as channel 1 (101A), is within a predefined range of the strongest channel's denoised speech signal RMS for the threshold period of time, and the denoised smoothed speech signal SRMS of channel 1 (101A) is within a predefined range of the strongest channel's denoised smoothed speech signal SRMS for the threshold period of time, the AGC may update the gain for channel 1 (101A). Otherwise, the AGC 130 may not update the gain value of a channel 101A-101M.

In updating the gain value for each channel 101A-101M, the AGC 130 may consider the conferencing device's current state 116. If the current state 116 is speech state 142, the AGC 130 may update the channel's gain value by a first number of decibels per second toward the target value. If the current state 116 is uncertain state 148, the AGC 130 may update the channel's gain value by a second number of decibels per second toward the target value. That is, the AGC 130 may update channel's gain value more gradually if the current state 116 of the conferencing device 110A-110N is uncertain 148 in order to avoid adjusting the gain toward a misclassified signal. This functionality may help avoid adapting the gain to noise. The AGC 130 may gradually update a channel's gain because quick gain changes can be distracting and annoying to a user.

The AGC 130's target value for a channel may be based on the root mean square of the smoothed denoised speech signal for that channel. The AGC 130 may have a maximum gain value that the target gain value may not exceed, which acts as a safety measure to avoid unreasonable gains. The conferencing device 110A-110N may then transmit each channel's denoised signal with its associated gain value.

Figure 2:
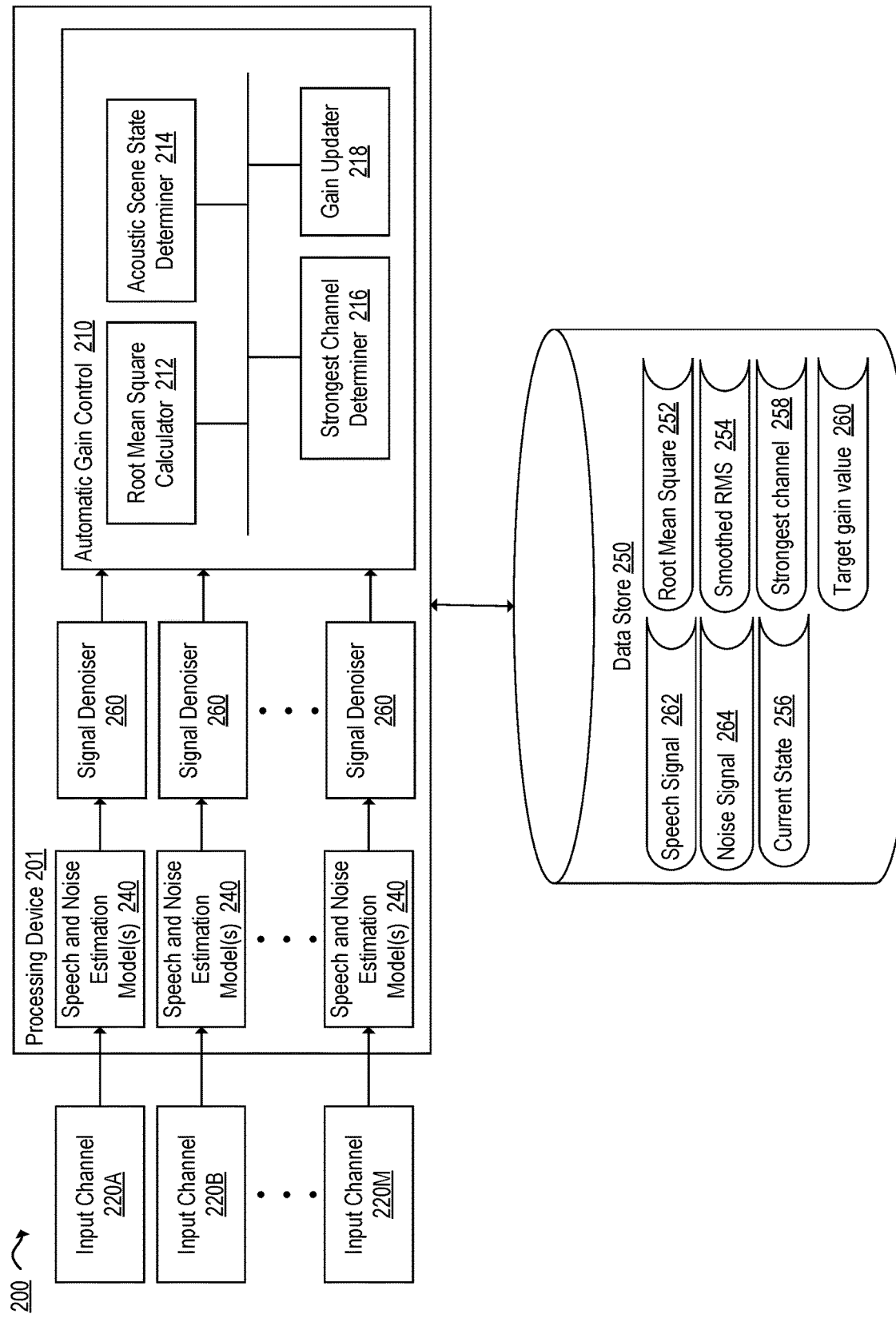
FIG. 2 depicts an example of a system architecture for an automatic gain control, in accordance with an implementation of the disclosure.

FIG. 2 depicts an example of a system architecture 200 for an automatic gain control, in accordance with an implementation of the disclosure.

The system architecture 200 includes one or more processing devices 201 and one or more data stores 250. In the example shown, the processing device 201 includes an automatic gain control 210. The processing device 201 may be included in a conferencing device 110A-110N in FIG. 1. The automatic gain control 210 may include a root mean square calculator 212, an acoustic scene state determiner 214, a strongest channel determiner 216, and a gain updater 218. The processing device may receive audio data from one or more input channels 220A-220M. For example, these input channels may come from microphones. Additionally or alternatively, input channels 220A-220M may be incorporated in the processing device 201. The processing device 201 may input data from each input channel 220A-220M into the speech and noise estimation model(s) 240. The speech and noise estimation model(s) 240 may be trained to determine speech audio energy levels and noise energy levels of given audio data. Some implementations of speech and noise estimation model training are described in more detail below with respect to FIG. 5. The speech and noise estimation model(s) 240 may output a speech mask and/or a noise mask for each frequency bin. A frequency bin is a segment of the frequency in the audio data. The speech mask may be a value representing the speech audio energy level of the frequency bin, and the noise mask may be a value representing the noise energy level of the frequency bin.

In some implementations, the speech and noise estimation model(s) 240 may be trained to determine speech audio energy levels and noise energy levels of given audio data in the time domain. That is, the speech and noise estimation model(s) 240 may output a denoised speech signal for each channel for one or more time portions, not split into a plurality of frequency bins.

The processing device 201 may input the audio data received from the input channel 220A-220M, and the speech and/or noise mask for each frequency bin corresponding to the input channel 220A-220M, into the signal denoiser 260. The signal denoiser 260 may form a denoised signal by multiplying the frequency spectrum of the original signal from input channel 220A-220M by the speech mask. The denoised signal may be referred to as a speech signal, and may be stored in speech signal 262 of data store 250. The signal denoiser 260 may also form a noise signal by multiplying the frequency spectrum of the original signal from input channel 220A-220M by the noise mask. The noise signal may be stored in noise signal 264 of data store 250. The speech signal and the noise signal of each input channel 220A-220M may then be inputted into the automatic gain control 210.

The root mean square calculator 212 may enable the processing device 201 to calculate the root mean square of each denoised speech signal 262. The root mean square may then be stored in root mean square 252 of data store 250. The root mean square calculator 212 may further smooth the denoised speech signal 262 of each input channel 220A-220M. The denoised speech signal is smoothed in order to capture the important patterns in the signal while overlooking potential outliers. In one implementation, the smoothing may have a half-time of 75 milliseconds. The root mean square calculator 212 may then calculate the root mean square of the smoothed speech signal, and store the smoothed root mean square in smoothed root mean square 254 of data store 250.

In some implementations, the root mean square calculator 212 bandpasses the denoised speech signal 262 of each input channel 220A-220M to a predetermined frequency region, and determines and stores the root mean square and smoothed root mean square of the bandpassed signals.

The acoustic scene state determiner 214 may determine the acoustic scene state of the conferencing device. The acoustic scene state determiner 214 may perform the same functions as the state machine 114 in FIG. 1. The acoustic scene state determiner 214 may use the denoised speech signal 262 of each input channel 220A-220M, and/or the noise signal 265 of each input channel 220A-220M, to determine the scene state of the room. The acoustic scene state determiner 214 may enable the processing device 201 to determine whether the scene state of the room is speech, uncertain, noise, or silence. The acoustic scene state may then be stored in current state 256 in data store 250.

In some implementations, the acoustic scene state determiner 214 may compare the root mean square of each channel's speech signal 262 and/or noise signal 265 to one or more threshold values in order to determine whether speech dominates the environment or room, whether noise dominates the environment or room, whether the room is silent, or whether the scene of the room is uncertain. Additionally or alternatively, the acoustic scene state determiner 214 may use other methods to determine the scene stare of the room.

The strongest channel determiner 216 may enable the processing device 201 to determine the channel with the strongest speech signal 262. That is, the strongest channel determiner 216 may compare the root mean square of denoised speech signals 262 for each input channel 220A-220M in order to determine the strongest signal. The strongest channel determiner 216 may also compare the root mean square of each smoothed denoised signal 262. The strongest channel 258 may be the channel that has the highest root mean square and the highest smoothed root mean square. The strongest channel may be stored in strongest channel 258 of data store 250.

The gain updater 218 may enable the processing device 201 to update the target gain value of each channel. The automatic gain control 210 may maintain a separate gain for each input channel 220A-220M. In order to update the gain for any channel, the gain updater 218 may first determine whether the strongest channel's root mean square and smoothed root mean square exceed their respective threshold values for a threshold period of time. The threshold values may help ensure that the gain is not adapting to weak noises or sounds. In comparing the root mean square and smoothed root mean square to the thresholds, the gain updater 218 may bandpass the signals to a frequency region. The threshold period of time may help ensure that the gain is not adapting to a sudden burst of noise, resulting in a more stable automatic gain control. If the strongest channel's root mean square and smoothed root mean square exceed their respective threshold values for the threshold period of time, the gain updater 218 may then update the gain values of each channel that is within a predefined range of the strongest channel. For example, for the first channel, i.e., for the denoised speech signal 262 of input channel 220A, the gain updater 218 may first determine whether the root mean square 252 and the smoothed root mean square 254 of denoised speech signal 262 for input channel 220A are both within a predefined range of the strongest channel 258's root mean square and smoothed root mean square for the threshold period of time. If so, the gain updater 218 may then determine whether the current state 256 is uncertain or speech for a threshold period of time. If all of the conditions have been met for the threshold period of time, the gain updater 218 may update the target gain value 260 for the first channel, i.e., input channel 220A. The target gain value 260 may be the smoothed root mean square 254 of that channel's denoised speech signal 262.

The gain updater 218 may gradually update the gain value of the channel. If the current state 256 is speech for the threshold period of time, the gain updater 218 may update the gain value by a first number of decibels per second, for example, by 3 decibels per second. If the current state 256 is uncertain for the threshold period of time, the gain updater 218 may update the gain value by a second number of decibels per second, for example, by 1 decibel per second. The gain updater 218 may also include a maximum gain value, which the target gain value 260 may not exceed.

Figure 3:
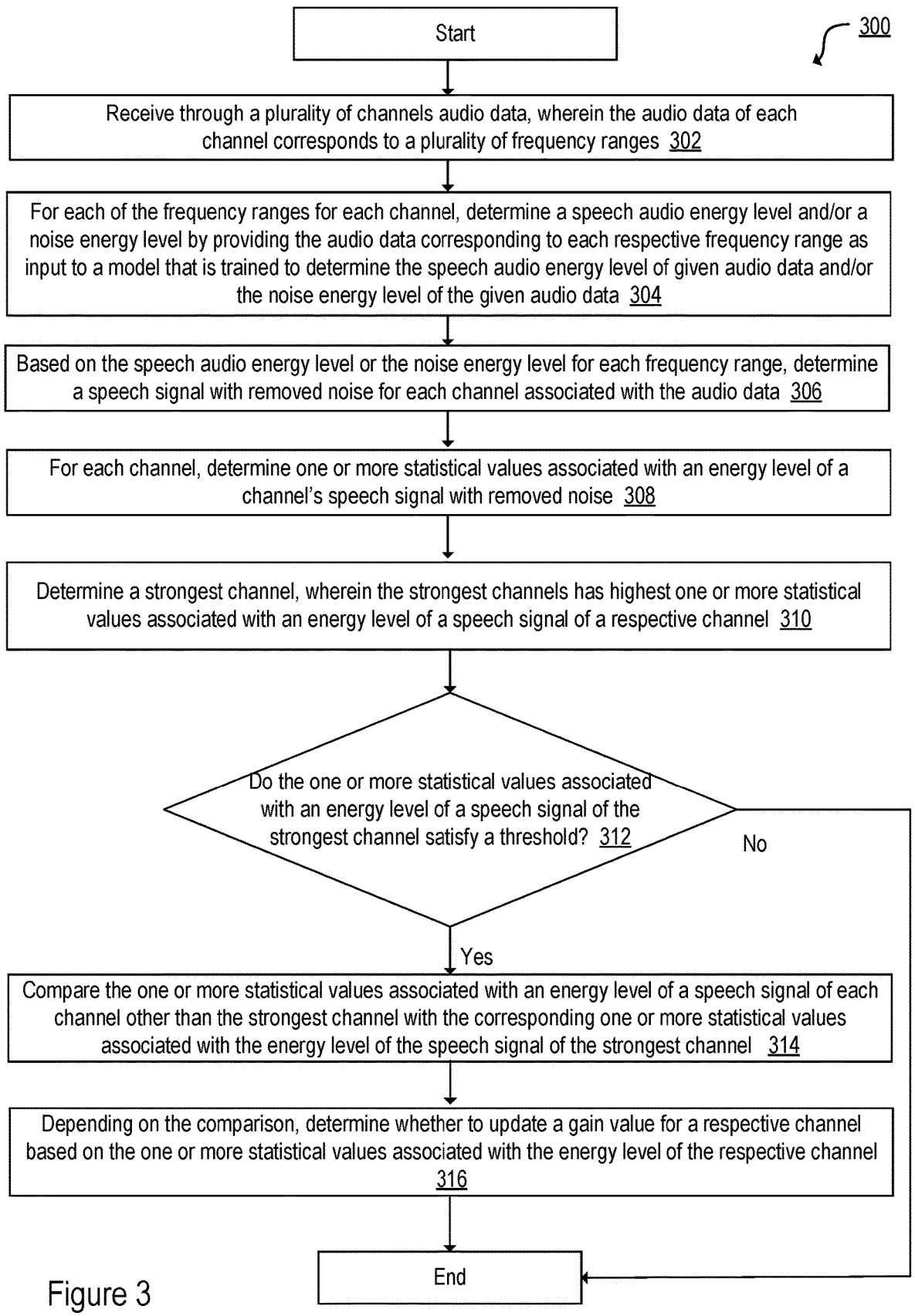
FIG. 3 depicts a flow diagram of a method for an automatic gain control based on a machine learning level estimation of the desired signal, in accordance with an implementation of the disclosure.
Figure 4:
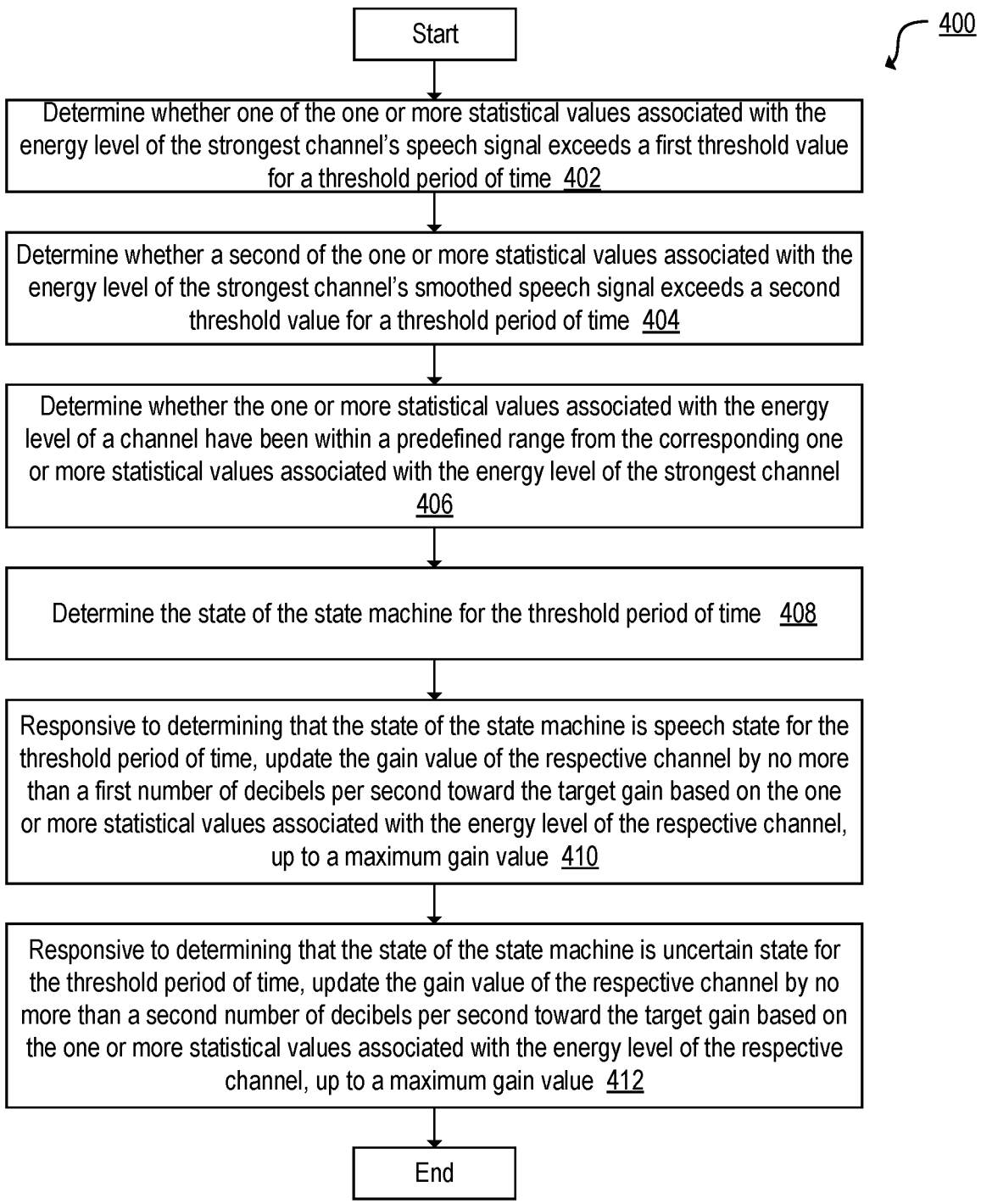
FIG. 4 depicts a flow diagram of a method of determining whether to update a gain value for an input channel, in accordance with an implementation of the disclosure.

FIGS. 3 and 4 depict flow diagrams of methods 300 and 400 performed in accordance with some implementations of the disclosure. The methods 300 and 400 may be performed by a client-based application that runs on a conferencing device 110A-110N. The client-based application may be executed by a processing device of the conferencing devices 110A-110N.

For simplicity of explanation, methods 300 and 400 of this disclosure are depicted and described as a series of acts. However, acts in accordance with this disclosure can occur in various orders and/or concurrently, and with other acts not presented and described herein. Furthermore, not all illustrated acts may be required to implement methods 300 and 400 in accordance with the disclosed subject matter. In addition, those skilled in the art will understand and appreciate that methods 300 and 400 could alternatively be represented as a series of interrelated states via a state diagram or events. Additionally, it should be appreciated that methods 300 and 400 disclosed in this specification are capable of being stored on an article of manufacture to facilitate transporting and transferring such method to computing devices. The term "article of manufacture," as used herein, is intended to encompass a computer program accessible from any computer-readable device or storage media.

FIG. 3 is a flow diagram of method 300 for an automatic gain control based on a machine learning level estimation of the desired signal, in accordance with some implementations of the disclosure.

Referring to FIG. 3, at operation 302, the processing device of conferencing device 110A-110N may receive, through a first channel of one or more channels, audio data corresponding to a plurality of frequency ranges. The conferencing device 110A-110N may be equipped with one or more microphones, each microphone representing one input channel. At operation 304, for each frequency range for each channel, the processing device may determine a speech audio energy level and/or a noise energy level by providing the audio data of each frequency range as input to a model that is trained to determine the speech audio energy level and the noise energy level of given audio. The model may return a speech mask, representing the level of speech in each frequency range, or the speech audio energy level. The model may take all frequency bands from a channel as an input array, and provide an output array with an estimation of the proportion of speech for each frequency bin (i.e., the speech mask). The model may also return a noise mask, representing the level of noise in each frequency, or the noise energy level.

At operation 306, the processing device may determine, based on the speech audio energy level and/or noise energy level of each frequency range, a speech signal with the noise removed for each channel. That is, the processing device may use the speech mask and/or the noise mask determined by the machine learning model to denoise the audio signal. The processing device may multiply each frequency range's signal by its associated speech mask, then combine the denoised frequency ranges to create a denoised speech signal for each channel.

At operation 308, the processing device may determine one or more statistical values associated with an energy level of a channel's denoised speech signal. In one implementation, the processing device may determine the root mean square of the denoised speech signal, as well as the smoothed root mean square of the denoised speech signal (sometimes referred to as the smoothed root mean square) for each channel. As described above, the denoised speech signal may be smoothed in order to capture the important patterns in the signal while omitting potential outliers.

At operation 310, the processing device may determine the strongest channel. The strongest channel may be the one with the highest one or more statistical values associated with the energy levels of a speech signal of a respective channel. In one implementation, the strongest channel may be the one with the highest denoised speech signal root mean square and the highest denoised speech signal smoothed root mean square, as compared to the other channels.

At operation 312, the processing device may determine that the one or more statistical values associated with the energy level of the speech signal of the strongest channel satisfy a threshold condition. In one implementation, the processing device may determine whether the root mean square of the strongest channel's denoised speech signal and the smoothed root mean square of the strongest channel's denoised speech signal satisfy a threshold condition. The threshold condition is satisfied if the strongest channel's denoised speech signal root mean square is above a first threshold value for a period of time, and the strongest channel's denoised speech signal smoothed root mean square is above a second threshold value for a period of time. In some implementations, the first and the second threshold values may the same value. If the threshold condition is not satisfied, the method ends and the processing device may not adjust the gain of any of the channels. By using this threshold condition, the method is ensuring that there is at least one strong input channel containing speech for which to adjust the gain. Without the threshold, the processing device may adjust the gain of channels with weak noises or sounds, resulting in slowly increasing gain in periods without speech.

If, the threshold condition in operation 312 is satisfied, the method moves on to operation 314. At operation 314, the processing device may compare the one or more statistical values associated with an energy level of a speech signal of each channel other than the strongest channel with the corresponding one or more statistical values associated with the energy level of the speech signal of the strongest channel. In one implementation, the processing device may compare the root mean square and the smoothed root mean square of each channel to the root mean square and the smoothed root mean square of the strongest channel, respectively.

At operation 316, depending on the comparison, the processing device may determine whether to update the gain value for a respective channel based on the one or more statistical value associated with the energy level of the respective channel, e.g. based on the smoothed root mean square of the speech signal of the respective channel. That is, for each channel that is within a predefined range of the strongest channel, the processing device may update the channel's gain value toward the target gain value. Each channel's target gain value is that channel's smoothed root mean square value.

FIG. 4 depicts a flow diagram of a method of determining whether to update a gain value for an input channel, in accordance with an implementation of the disclosure.

At operation 402, the processing device may determine whether the one of the one or more statistical values associated with the energy level of the strongest channel exceeds a first threshold value for a threshold period of time. In one implementation, the processing device may determine whether the root mean square of the strongest channel's speech signal exceeds a first threshold value for a threshold period of time. At operation 404, the processing device may then determine whether a second of the one or more statistical values associated with the energy level of the strongest channel exceeds a second threshold value for a threshold period of time. In one implementation, the processing device may determine whether the smoothed root mean square the strongest channel's smoothed speech signal exceeds a second threshold value for the threshold period of time.

At operation 406, in comparing each channel to the strongest channel, the processing device may determine whether the one or more statistical values associated with the energy level of the respective channel have been within a predefined range from the corresponding one or more statistical values associated with the energy level of the strongest channel. In one implementation, the processing device may determine whether the root mean square of the respective channel and the smoothed root mean square of the respective channel have been within a predefined range from the root mean square of the strongest channel and the smoothed root means square of the strongest channel. At operation 408, the processing device may determine the state of the state machine for the threshold period of time.

At operation 410, responsive to determining that the state of the state machine is speech state for the threshold period of time, the processing device may update the gain value of the respective channel by no more than a first number of decibels per second toward the target gain based on the one or more statistical values associated with the energy level of the respective channel (e.g., based on the root mean square of the smoothed speech signal of the respective channel), up to a maximum gain value.

At operation 412, responsive to determining that the state of the state machine is uncertain state for the threshold period of time, the processing device may update the gain value of the respective channel by no more than a second number of decibels per second toward the target gain based on the one or more statistical values associated with the energy level of the respective channel (e.g., based on the root mean square of the smoothed speech signal of the respective channel), up to a maximum gain value. The method then ends.

Figure 5:
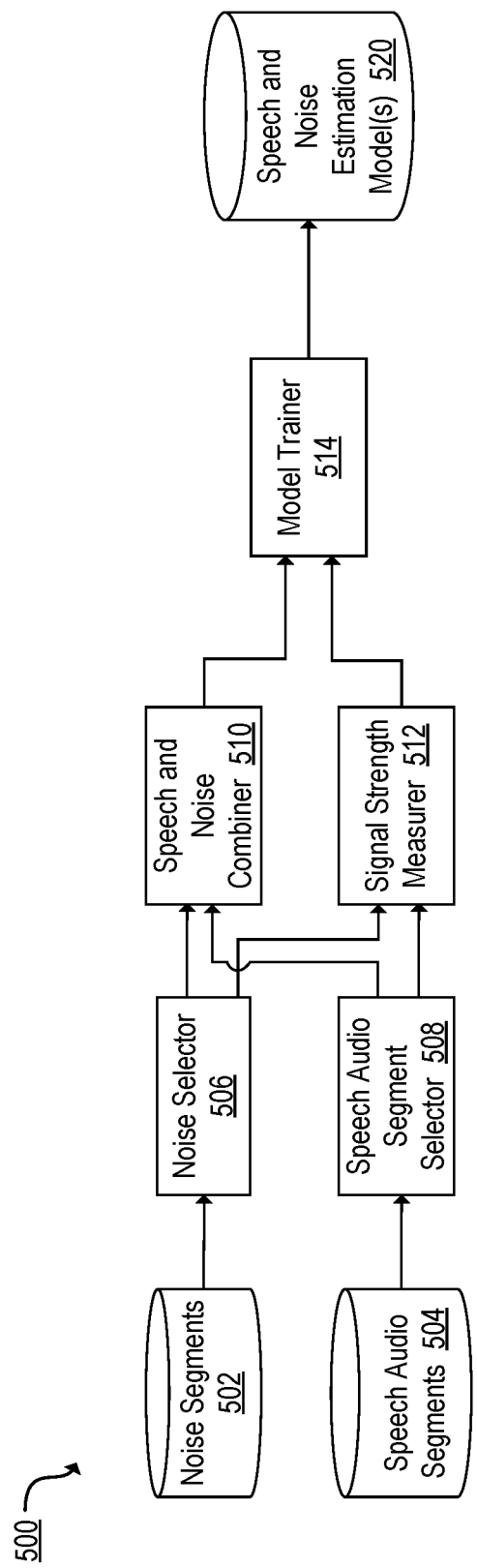
FIG. 5 depicts an example of a system architecture for training a speech level estimation model, in accordance with an implementation of the disclosure.

FIG. 5 illustrates an example system 500 for training a speech level estimation model for use in a conferencing system, in accordance with an implementation of the disclosure. The system 500 may be included in the conference devices 110A-110N of FIG. 1, or included in a separate computing device. The separate computing device may be any type of computing device that is capable of processing audio segments. The system 500 may train speech and noise estimation model(s) 120 for use in system 100 of FIG. 1.

The system 500 may include speech audio segments 504. The speech audio segments 504 may include clean segments of different speakers speaking different phrases. For example, one audio segment may be a woman speaking "can I make an appointment for tomorrow" without any background noise. Another audio segment may be a man speaking "please give me directions to the store" without any background noise. In some implementations, the speech audio segments 504 may include an amount of background noise that is below a certain threshold because it may be difficult to obtain speech audio segments that do not include any background noise. In some implementations, the speech audio segments may be generated by various speech synthesizers with different voices. The speech audio segments 504 may include only spoken audio segments, only speech synthesis audio segments, or a mix of both spoken audio segments and speech synthesis audio segments.

The system 500 may include noise segments 502. The noise segments 502 may include segments of several different types of noise. The noise segments may include stationary noise and/or non-stationary noise. For example, the noise segments 502 may include street noise segments, road noise segments, cocktail noise segments, office noise segments, etc. The noise segments 502 may be collected through a microphone or may be generated by a noise synthesizer.

The noise selector 506 may be configured to select a noise segments from the noise segments 502. The noise selector 506 may be configured to cycle through the different noise segments and track those noise segments have already been selected. The noise selector 506 may provide the selected noise segment to the speech and noise combiner 510 and the signal strength measurer 512. In some implementations, the noise selector 506 may provide one noise segment to the speech and noise combiner 510 and the signal strength measurer 512. In some implementations, the noise selector 506 may provide more than one noise segment to the speech and noise combiner 510 and the signal strength measurer 512 such as one office noise segment and one street noise segment or two office noise segments.

The speech audio segment selector 508 may operate similarly to the noise selector. The speech audio segment selector 508 may be configured to cycle through the different speech audio segments and track those speech audio segments that have already been selected. The speech audio segment selector 508 may provide the selected speech audio segment to the speech and noise combiner 510 and the signal strength measurer 512. In some implementations, the speech audio segment selector 508 may provide one speech audio segment to the speech and noise combiner 510 and the signal strength measurer 512. In some implementations, the speech audio segment selector 508 may provide more than one speech audio segment to the speech and noise combiner 510 and the signal strength measurer 512 such as one speech segment of "what time is the game on" and another speech segment of "all our tables are booked for that time."

The speech and noise combiner 510 may combine the one or more noise segments received from the noise selector 506 and the one or more speech audio segments received from the speech audio segment selector 508. The speech and noise combiner 510 may combine the segments by overlapping them and summing the segments. In this sense, more than one speech audio segment will overlap to imitate more than one person talking at the same time. In instances where the received segments are not all the same length in time, the speech and noise combiner 510 may extend an audio segment by repeating the segment until the needed time length is reached. For example, if one the speech audio segments is of "call mom" and another speech segment is of "can I make a reservation for tomorrow evening," then the speech and noise combiner 510 may concatenate multiple segments of "call mom" to reach the length of "can I make a reservation for tomorrow evening." In instances where the speech and noise combiner 510 combines multiple speech audio files, the speech and noise combiner 510 may output the combined speech audio with noise added and the combined speech audio without noise added.

The signal strength measurer 512 may calculate a signal strength of the individual speech audio segment included in each combined speech and noise segment and the signal strength of the individual noise segment included in each combined speech and noise segment. In some implementations, the signal strength measurer 512 may calculate the speech audio signal strength and the noise signal strength for a particular time periods in each segment. For example, the signal strength measurer 512 may calculate the speech audio signal strength and the noise signal strength over a one second period, a three second period, or another time period. The strength measurer 512 may calculate additional signal strengths if there is audio remaining in the segment.

In some implementations, the signal strength measurer 512 may calculate the speech audio signal strength and the noise signal strength for a different frequency bands in each segment. For example, the signal strength measurer 512 may calculate the speech audio signal strength and the noise signal strength for each one hundred hertz bands, one hundred twenty-five hertz bands, or another similar frequency band.

In some implementations, the signal strength measurer 512 may calculate the speech audio signal strength for a combined speech audio signal. In this instance, the signal strength measurer 512 calculate the signal strength of the combined speech audio signals in a similar fashion as described above. In some implementations, the signal strength measurer 512 may calculate the noise signal strength for a combined noise signal. In this instance, the signal strength measurer 512 may calculate the signal strength of the combined noise signals in a similar fashion as described above.

The model trainer 514 may use machine learning to train a model. The model trainer 514 may train the model to receive an audio segment that includes speech and noise and output a speech signal strength value for the speech included in the audio segment and a noise signal strength value for the noise included in the audio segment. To train the model, the model trainer 514 may use audio segments received from the speech and noise combiner 510 that include speech and noise and that are labeled with the speech signal strength value and the noise signal strength value.

In some implementations, the signal strength labels include a speech signal strength value and a noise signal strength value for each frequency band in the audio segment. In this instance, the model trainer 514 may train the model to generate a speech signal strength value and a noise signal strength for each frequency band upon receiving an audio data. The size of the frequency bands may be one hundred hertz, one hundred twenty-five hertz, or another similar size.

In some implementations, the model trainer 514 may train a model for each frequency band. In this instance, the model trainer 514 may receive audio segments and speech signal strength values and noise signal strength values for different frequency bands in the audio segments. The model trainer 514 may train each model using the audio segments and a respective speech signal strength value and a respective noise signal strength value. For example, the model trainer 514 may train a model for the 2.1-2.2 kHz band. The model trainer 514 may use the audio segments and the speech signal strength value and noise signal strength value for the 2.1-2.2 kHz bands in each audio segment. Additionally, or alternatively, the model trainer 514 trains each model using filtered audio segments for each frequency band and the speech signal strength values and the noise signal strength values for that frequency band. For example, the model trainer 514 filters the audio segments to isolate the 2.1-2.2 kHz band. The model trainer 514 trains the 2.1-2.2 kHz band using the filtered audio segments and the speech signal strength values and the noise signal strength values for the 2.1-2.2 kHz band. Before providing an audio input to this model, the system applies a 2.1-2.2 kHz band filter to the audio input.

The model trainer 514 may store the trained model(s) in the speech and noise estimation model(s) 520. Each model in the speech and noise estimation models 520 may indicate whether it is configured to estimate the speech and noise levels for the whole audio segment or for a particular frequency band. Additionally, each model in the speech and noise estimation models 520 may indicate whether any filtering should be applied to the audio before providing the audio to the model. For example, the 2.1-2.2 kHz band may indicate to filter the audio using a 2.1-2.2 kHz band filter before applying the model.

Additionally or alternatively, the model trainer 514 may train one speech and noise estimation model 520 that covers all frequency bands. The model trainer 514 may train one model that takes all frequency bands from a channel as an input array, and provide an output array with an estimation of the proportion of speech for each frequency band.

Additionally or alternatively, the model trainer 514 may train a speech and noise estimation model 520 in the time domain. This model trainer may use a temporal convolutional network to determine masks used to separate speech from noise in the time domain. The model trainer may receive as input audio data from one or more input channels (e.g., from one or more microphones) corresponding to one or more time-related portions, each portion having a start time and an end time. For example, the input may be broken up into portions of 2 milliseconds. The model trainer may train the model to determine a denoised speech signal for each time-related portions, and combine the time-related portions to create a denoised speech signal for each channel.

Figure 6:
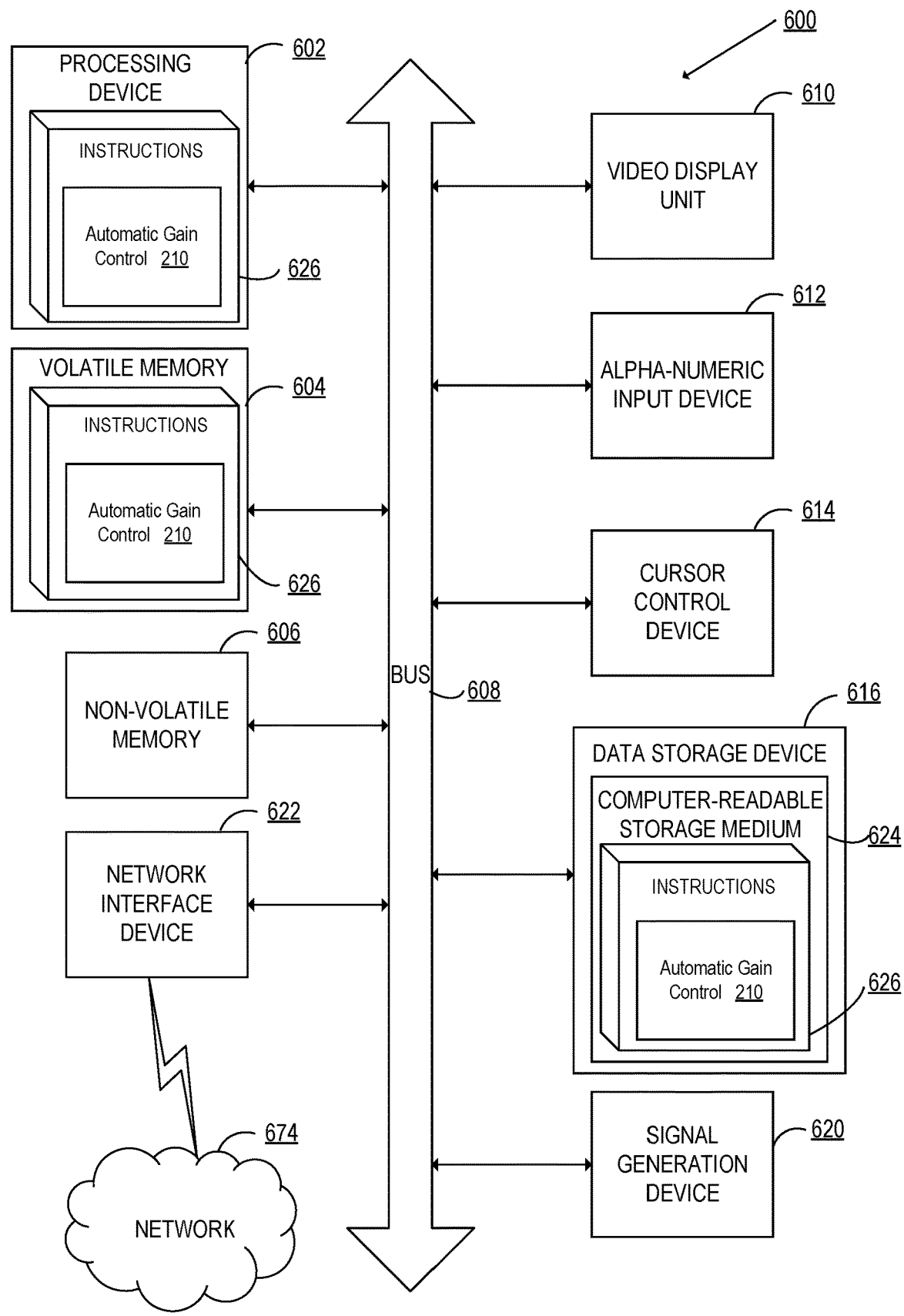
FIG. 6 depicts a block diagram of a computer system operating in accordance with an implementation of the disclosure.

FIG. 6 depicts a block diagram of a computer system operating in accordance with one or more aspects of the present disclosure. In various illustrative examples, computer system 600 may correspond to any of the computing devices within system architecture 100 of FIG. 1. In one implementation, the computer system 600 may be each of the conferencing devices 110A-110N of FIG. 1.

In certain implementations, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., random access memory (RAM)), a non-volatile memory 606 (e.g., read-only memory (ROM) or electrically-erasable programmable ROM (EEPROM)), and a data storage device 616, which may communicate with each other via a bus 608.

Processing device 602 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 600 may further include a network interface device 622. Computer system 600 may also include a video display unit 610 (e.g., an LCD), an alphanumeric input device 612 (e.g., a keyboard), a cursor control device 614 (e.g., a mouse), and a signal generation device 620.

Data storage device 616 may include a non-transitory computer-readable storage medium 624 on which may store instructions 626 encoding any one or more of the methods or functions described herein, including instructions for implementing methods 300 and 400, and for automatic gain control 210 of FIG. 2.

Instructions 626 may also reside, completely or partially, within volatile memory 604 and/or within the processing device 602 during execution thereof by computer system 600, hence, volatile memory 604, and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer and cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware resources. Further, the methods, components, and features may be implemented in any combination of hardware resources and computer program components, or in computer programs.

Unless specifically stated otherwise, terms such as "initiating," "transmitting," "receiving," "analyzing," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods 300 and 400, and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A system comprising:
a memory; and
a processing device communicably coupled to the memory, the processing device to:
receive, from a plurality of input devices, audio data, wherein the audio data of each input device corresponds to a plurality of frequency ranges;
determine, for each of the plurality of frequency ranges for each input device of the plurality of input devices, a speech energy level by providing audio data corresponding to each frequency range as input to a model that is trained to determine a speech energy level of given audio data in the corresponding frequency range of the plurality of frequency ranges;
for each input device, determine a statistical value associated with the speech energy level of the input device;
identify a strongest input device, wherein the strongest input device has highest statistical value associated with the speech energy level;
compare the statistical value associated with the speech energy level of each input device other than the strongest input device with the statistical value associated with the speech energy level of the strongest input device; and
depending on the comparing, determine whether to update, for a respective input device, a gain value to an estimated target gain value based on the statistical value associated with the speech energy level of the respective input device.

2. The system of claim 1, wherein the processing device is further to:
determine that the statistic value associated with the speech energy level of the strongest input device satisfies a threshold condition.

3. The system of claim 2, wherein the threshold condition requires that the statistical value associated with the speech energy level of the strongest input device be above a respective threshold value for a threshold period of time.

4. The system of claim 1, wherein to determine whether to update the gain value for the respective input device, the processing device is further to:
   determine whether the statistical value associated with the speech energy level of the respective input device has been within a predefined range of the statistical value associated with the speech energy level of the strongest input device for a period of time.

5. The system of claim 1, wherein the processing device is further to:
   based on the speech energy level, update a state of a state machine that includes a speech state, a noise state, a silence state, and an uncertain state.

6. The system of claim 5, wherein the processing device is further to:
   update the gain value for the respective input device, wherein to update the gain value for the respective input device, the processing device is further to:
      determine whether the state of the state machine is speech state for a threshold amount of time;
      responsive to determining that the state of the state machine is speech state for the threshold amount of time, update the gain value by no more than a first number of decibels per second;
      determine whether the state of the state machine is uncertain state for the threshold amount of time; and
      responsive to determining that the state of the state machine is uncertain state for the threshold amount of time, update the gain value by no more than a second number of decibels per second.

7. The system of claim 1, wherein the processing device is further to:
   receive speech audio segments and noise segments;
   determine a noise energy level of each noise segment and a speech energy level of each speech audio segment;
   generate noisy speech audio segments by: overlapping each noise segment and each audio segment in a time domain, and summing each noise segment and each audio segment; and
   train, using machine learning, the model using the noise energy level of each noise segment, a speech audio energy level of each speech audio segment, and the noisy speech audio segments.

8. A method comprising:
   receiving, by a server device from a plurality of input devices, audio data, wherein the audio data of each input device corresponds to a time-related portion of the audio data;
   determining, for each input device of the plurality of input devices, a speech energy level by providing the time-related portion of audio data as input to a model that is trained to determine at least one of a speech energy level of given audio data;
   for each input device, determining a statistical value associated with the speech energy level;
   identifying a strongest input device, wherein the strongest input device has highest statistical value associated with the speech energy level;
   comparing the statistical value associated with the speech energy level of each input device other than the strongest input device with the statistical value associated with the speech energy level of the strongest input device; and
   depending on the comparing, determining whether to update, for a respective input device, a gain value to an estimated target value based on the statistical value associated with the speech energy level of the respective input device.

9. The method of claim 8, further comprising:
   determining that the statistical value associated with the speech energy level of the strongest input device satisfies a threshold condition.

10. The method of claim 9, wherein the threshold condition requires that the statistical value associated with the speech energy level of the strongest input device be above a respective threshold value for a threshold period of time.

11. The method of claim 8, wherein determining whether to update the gain value for the respective input device comprises:
   determining whether the statistical value associated with the speech energy level of the respective input device has been within a predefined range of the statistical value associated with the speech energy level of the strongest input device for a period of time.

12. The method of claim 8, comprising:
   based on the speech energy level, updating a state of a state machine that includes a speech state, a noise state, a silence state, and an uncertain state.

13. The method of claim 12, further comprising:
   updating the gain value for the respective input device, wherein updating the gain value for the respective input device further comprises:
      determining whether the state of the state machine is speech state for a threshold amount of time;
      responsive to determining that the state of the state machine is speech state for the threshold amount of time, updating the gain value by no more than a first number of decibels per second;
      determining whether the state of the state machine is uncertain state for the threshold amount of time; and
      responsive to determining that the state of the state machine is uncertain state for the threshold amount of time, updating the gain value by no more than a second number of decibels per second.

14. The method of claim 8, comprising:
   receiving speech audio segments and noise segments;
   determining a noise energy level of each noise segment and a speech energy level of each speech audio segment;
   generating noisy speech audio segments by combining each noise segment and each speech audio segment; and
   training, using machine learning, the model using the noise energy level of each noise segment, a speech audio energy level of each speech audio segment, and the noisy speech audio segments.

15. The method of claim 14, wherein combining each noise segment and each speech audio segment comprises overlapping each noise segment and each audio segment in a time domain and summing each noise segment and each audio segment.

16. A non-transitory machine-readable storage medium comprising instructions for a server that, when executed by a processing device, cause the processing device to perform operations comprising:
   receiving, from a plurality of input devices, audio data, wherein the audio data of each input device corresponds to a plurality of frequency ranges;
   determining, for each of the plurality of frequency ranges for each input device of the plurality of input devices, a speech energy level by providing audio data corresponding to each frequency range as input to a model that is trained to determine a speech energy level of given audio data in the corresponding frequency range of the plurality of frequency ranges;

for each input device, determining a statistical value associated with the speech energy level of the input device;

identifying a strongest input device, wherein the strongest input device has highest statistical value associated with the speech energy level;

comparing the statistical value associated with the speech energy level of each input device other than the strongest input device with the statistical value associated with the speech energy level of the strongest input device; and depending on the comparing, determining whether to update, for a respective input device, a gain value to an estimated target gain value based on the statistical value associated with the speech energy level of the respective input device.

17. The non-transitory machine-readable storage medium of claim 16, further comprising:
determining that the statistic value associated with the speech energy level of the strongest input device satisfies a threshold condition.

18. The non-transitory machine-readable storage medium of claim 17, wherein the threshold condition requires that the statistical value associated with the speech energy level of the strongest input device be above a respective threshold value for a threshold period of time.

19. The non-transitory machine-readable storage medium of claim 16, wherein determining whether to update the gain value for the respective input device comprises:
determining whether the statistical value associated with the speech energy level of the respective input device has been within a predefined range of the statistical value associated with the speech energy level of the strongest input device for a period of time.

20. The non-transitory machine-readable storage medium of claim 16, further comprising:
based on the speech energy level, updating a state of a state machine that includes a speech state, a noise state, a silence state, and an uncertain state; and
updating the gain value for the respective input device by:
determining whether the state of the state machine is speech state for a threshold amount of time;
responsive to determining that the state of the state machine is speech state for the threshold amount of time, updating the gain value by no more than a first number of decibels per second;
determining whether the state of the state machine is uncertain state for the threshold amount of time; and
responsive to determining that the state of the state machine is uncertain state for the threshold amount of time, updating the gain value by no more than a second number of decibels per second.

* * * * *